(12) United States Patent
Xotta et al.

(10) Patent No.: US 12,380,931 B2
(45) Date of Patent: Aug. 5, 2025

(54) CROSS-TEMPERATURE COMPENSATION IN A MEMORY SUB-SYSTEM

(71) Applicant: Micron Technology, Inc., Boise, ID (US)

(72) Inventors: Andrea Giovanni Xotta, Cornedo Vicentino (IT); Umberto Siciliani, Rubano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 172 days.

(21) Appl. No.: 18/237,816

(22) Filed: Aug. 24, 2023

(65) Prior Publication Data

US 2024/0071427 A1 Feb. 29, 2024

Related U.S. Application Data

(60) Provisional application No. 63/401,537, filed on Aug. 26, 2022.

(51) Int. Cl.
*G11C 7/04* (2006.01)
*G11C 7/10* (2006.01)

(52) U.S. Cl.
CPC .............. *G11C 7/04* (2013.01); *G11C 7/1069* (2013.01); *G11C 7/1096* (2013.01)

(58) Field of Classification Search
CPC ........ G11C 7/04; G11C 7/1069; G11C 7/1096
See application file for complete search history.

(56) References Cited

U.S. PATENT DOCUMENTS

2017/0255403 A1* 9/2017 Sharon ..................... G06F 3/064
2024/0249782 A1* 7/2024 Choi ........................ G11C 16/349

\* cited by examiner

*Primary Examiner* — Han Yang
(74) *Attorney, Agent, or Firm* — Lowenstein Sandler LLP (57) ABSTRACT

Control logic in a memory device receives, from a requestor, a request to read data from the memory array, the request comprising an indication of a segment of the memory array where the data is stored and performs, using previously configured read operation parameters, a first read operation to read the data and a write temperature associated with the data from the memory array. The control logic determines whether the previously configured read operation parameters satisfy a temperature criterion and responsive to determining that the previously configured read operation parameters do not satisfy the temperature criterion, configures the memory device with updated read operation parameters, and performs, using the updated read operation parameters, a second read operation to read the data from the memory array.

20 Claims, 7 Drawing Sheets

CROSS-TEMPERATURE COMPENSATION IN A MEMORY SUB-SYSTEM

RELATED APPLICATIONS

This application claims the benefit of U.S. Provisional Patent Application No. 63/401,537, filed Aug. 26, 2022, the entire contents of which are hereby incorporated by reference herein.

TECHNICAL FIELD

Embodiments of the disclosure relate generally to memory sub-systems, and more specifically, relate to cross-temperature compensation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to cross-temperature compensation in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NAND memory, such as 3D flash NAND memory, offers storage in the form of compact, high density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are formed onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

Bit flip errors can occur in certain memory devices when there is not enough separation between respective threshold voltages ($V_t$) of two adjacent bit levels (also referred to as "states"). Typically, each binary value stored in a memory cell has a different associated threshold voltage, with the lowest binary value having the highest threshold voltage, the highest binary value having the lowest threshold voltage, and intermediate states having progressively different threshold voltage values. For example, a memory cell configured as triple level cell (TLC) memory can have eight states, with each state having a corresponding $V_t$. Similarly, a memory cell configured as quad level cell (QLC) memory can have 16 states, with each state having a corresponding $V_t$. In certain memory devices, bit flip errors can be reduced (e.g., minimized) through providing a better separation of levels in a threshold voltage ($V_t$) distribution. The separation between two adjacent levels is reduced, however, when more bits are stored per memory cell.

In many memory devices, the level separation in threshold voltages becomes further reduced (or shifted) due to changes in environmental conditions, such as cross-temperature effects. Cross temperature negatively impacts level separation in situations where the memory cell operates (e.g., is read) at a temperature range which is different from a temperature at which the memory cell was programmed. For example, cross temperature effects can arise when data is read from a memory cell at a temperature that is different from the temperature at which data was written into the memory cell. Cross-temperature-induced errors can be accumulated by one or both of shifted levels that cross thresholds boundaries causing bit flip errors and/or overlapping levels causing increased number of bit flip errors. Bit flip errors reduce reliability and data retention capability as a result of the increased error rate. As the difference between a data write temperature and a data read temperature increases, so does the error rate of the data as a result of level shift and level overlap.

As the storage capacity of a memory cell is increased to store more bits, meeting the reliability requirements of the memory sub-system can utilize additional error correction operations. For example, error correction codes (ECC) can be used to correct the cross-temperature related bit errors. QLC NAND-based SSDs can utilize more complex error correction operations than those using SLC, MLC or TLC NAND flash. Thus, under certain cross-temperature conditions, a large number of error correction operations will be performed to correct the cross-temperature related bit flip errors. These error correction operations reduce throughput in the memory sub-system and increase read command latency.

Certain memory devices and memory sub-systems attempt to reduce the error rates using a variety of techniques, including adjusting the read voltage level. This can include determining a compensation offset value to account for a given memory cell's shift in threshold voltage. Since the threshold voltage shift can vary depending on process variations in each memory cell, the location of the memory cell (i.e., die to die variations), and the number of program/erase cycles performed on the cell, such a calibration process can be complicated. For example, certain memory devices perform an instantaneous read voltage calibration to adjust the read voltage level applied during a read operation as a function of the ambient temperature at the time the read operation is performed. Such devices typically do not account for the temperature at which the data being read was originally programmed and thus do not address the specific problems associated with cross-temperature. Other memory devices do attempt to apply read voltage offsets based on the cross-temperature, however, since most memory devices do not track the temperature at which the data was written, the memory devices rely on the memory sub-system controller to determine the cross-temperature which adds latency and complexity to the read operation. Still other memory devices attempt to reduce error rates by calibrating the read voltage level based on a number of program/erase cycles performed on a given segment (e.g., page or block) of the memory device. As the number of program/erase cycles can vary greatly per segment, such tracking can be complicated and require numerous expensive additional data structures to be maintained by the memory sub-system.

Aspects of the present disclosure address the above and other deficiencies by providing cross-temperature compensation in the memory sub-system. In one embodiment, while performing a write operation to write host data to a page of a memory device, control logic on the memory device can store an indication of the temperature at which the data is written (i.e., the "write temperature") with the host data in a segment of the memory device. For example, the control logic can store the write temperature in a flag byte associated with the segment. Depending on the embodiment, the write temperature can be tracked directly by the control logic on the memory device or can be received from a memory sub-system controller or host system that issued a write command associated with the write operation. This information can remain stored on the memory device and can be quickly accessed when the host data written to the segment is later read.

When a read command is received at the memory device from either the memory sub-system controller or host system, the control logic on the memory device can identify the segment of the memory device to be read and read the data and the corresponding write temperature of the requested data stored on the memory device. To perform this initial read operation, the control logic can utilize either default or the most recently used configuration settings for certain parameters (e.g., read voltage offset) of the read operation. Upon reading the write temperature, the control logic can determine the cross-temperature (i.e., a difference between the write temperature and the ambient temperature at the time when the read command is received). In one embodiment, the control logic on the memory device can determine, based on one or more of the write temperature, the read temperature, or the cross-temperature, whether an update to the configuration settings for the read operation is needed. If not, the control logic can simply return the read host data to the requestor. If an update is needed, however, the control logic can adjust the configuration settings for one or more parameters associated with the read operation, reread the requested data using the adjusted settings, and return the data to the requestor. Although the read time is increased in this scenario, since temperature compensated configuration settings are used for the second read operation, the number of errors should be reduced and the requestor (e.g., the memory sub-system controller) should experience reduced error handling trigger rates.

In another embodiment, the control logic returns the requested host data to the requestor regardless of whether an update to the configuration settings is warranted based on the cross-temperature. The requestor (e.g., the memory sub-system controller) will process the requested data and if the error rate is too high, for example, will re-issue a read command for the same data. Since the control logic of the memory device has determined the actual write temperature and cross-temperature, however, the control logic can re-read the data with adjusted configuration settings for the one or more parameters associated with the read operation. Accordingly the error rate in the data read the second time should be reduced. In this manner, the control logic of the memory device need only re-read the data if the requestor actually fails in correcting the errors in the data read initially. In some instances, even one or more of the write temperature, read temperature, or cross-temperature would warrant different configuration settings, it may be that the data read using sub-optimal configuration settings may still be usable by the requestor. Thus, the data may not need to be re-read at all.

Advantages of these approaches include, but are not limited to, improved performance in the memory sub-system. The techniques described herein provide a simple on-die cross-temperature solution that leverages write temperature and read temperature for a given segment of the memory device. These approaches can be used to adjust the read voltage offsets and read commands to strike a balance between performance and quality of service at normal operating conditions and extreme conditions. Longer latency and lower error rate commands can be selectively deployed only under stringent operating conditions to reduce the error handling trigger rates in the memory sub-system. Mitigating error handling trigger rates in this manner, despite longer latency, can improve the average throughput and quality of service.

Figure 1A:
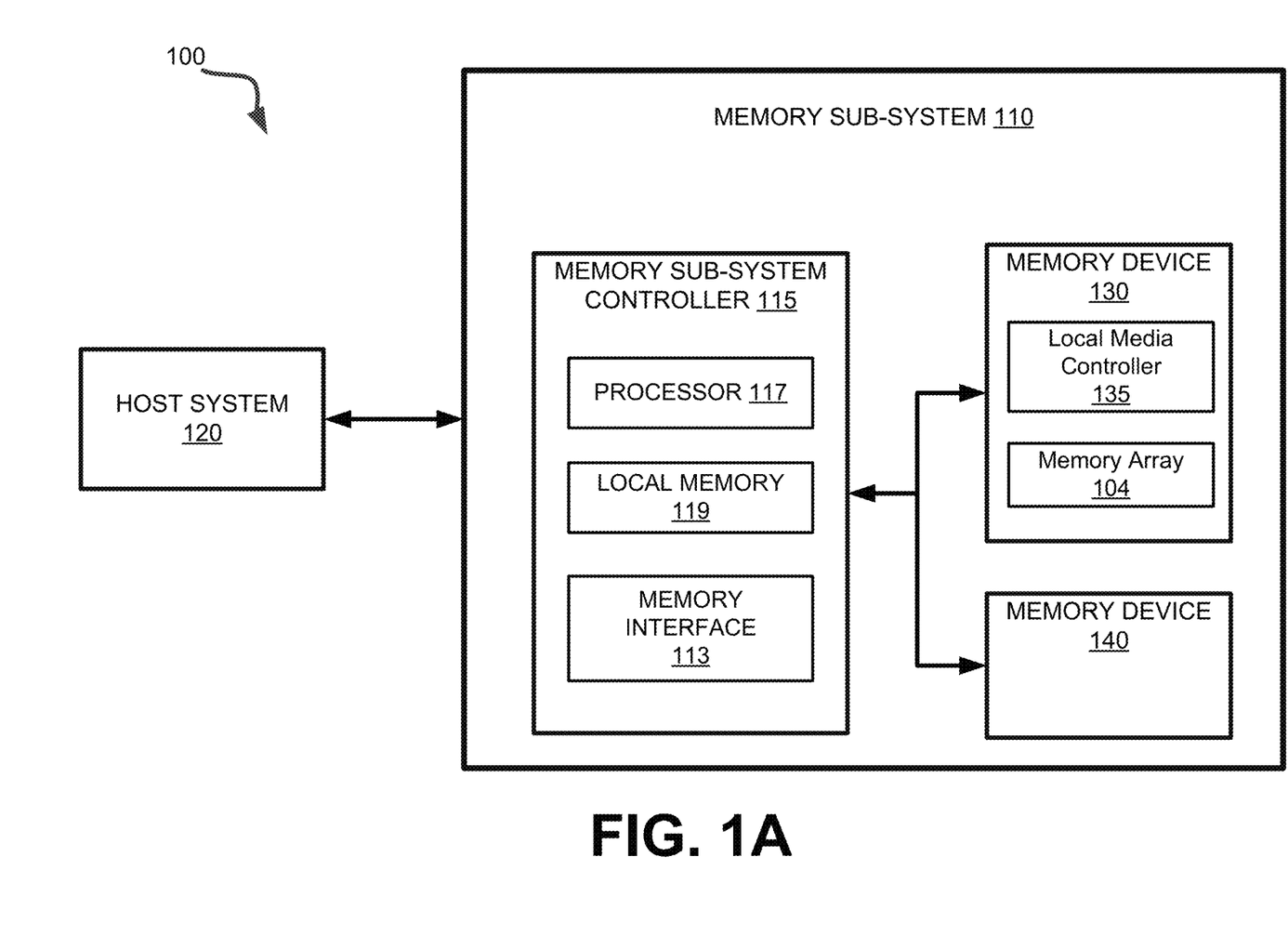
FIG. 1A illustrates an example computing system that includes a memory sub-system in accordance with some embodiments of the present disclosure.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCR), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

In one embodiment, memory device 130 includes local media controller 135 and a memory array 104. As described herein, the memory array 104 can be logically or physically divided into a number of segments (e.g., dies, blocks, pages, etc.). Each segment can include one or more flag bytes, which are restricted areas of the memory array 104 that store system data or other metadata, and are typically not accessible or usable by the host system 120. In one embodiment, local media controller 135 can utilize the flag bytes in memory array 104 to store certain information associated with the host data written to corresponding segments of the memory array 104. For example, in response to receiving a write (i.e., program) request or command from memory interface 113, and while performing a write operation corresponding to the request to write host data to a page of memory array 104, local media controller 135 can store an indication of the temperature at which the data is written (i.e., the "write temperature") in a flag byte associated with that page. In another embodiment, local media controller 135 can store the indication of the write temperature at some other location in memory device 130, such as together with the host data being programmed to the memory array 104. Depending on the embodiment, the write temperature can be tracked directly by local media controller 135 or can be received from memory interface 113 along with the write request. This information can remain stored on memory device 130 and can be used for read voltage calibration when the host data written to the page is later read. Since the write temperature is stored on memory device 130, when performing a read operation at a later time, local media controller 135 can quickly and easily access the information, perform associated calculations (e.g., determine a cross-temperature, compare cross-temperature to previous values, etc.), and determine whether calibration of a read voltage to be applied to memory array 104 as part of the read operation, or other parameters associated with the read operation, is appropriate. In this manner, local media controller 135 can selectively take corrective action to adjust the read voltage level (e.g., apply a read voltage offset to a default read voltage level) only when necessary, and can prevent the added latency in completing the read operation associated with both taking unwarranted corrective action and having to access cross-temperature data from memory sub-system controller 115. Further details with regards to the operations of local media controller 135 are described below.

Figure 1B:
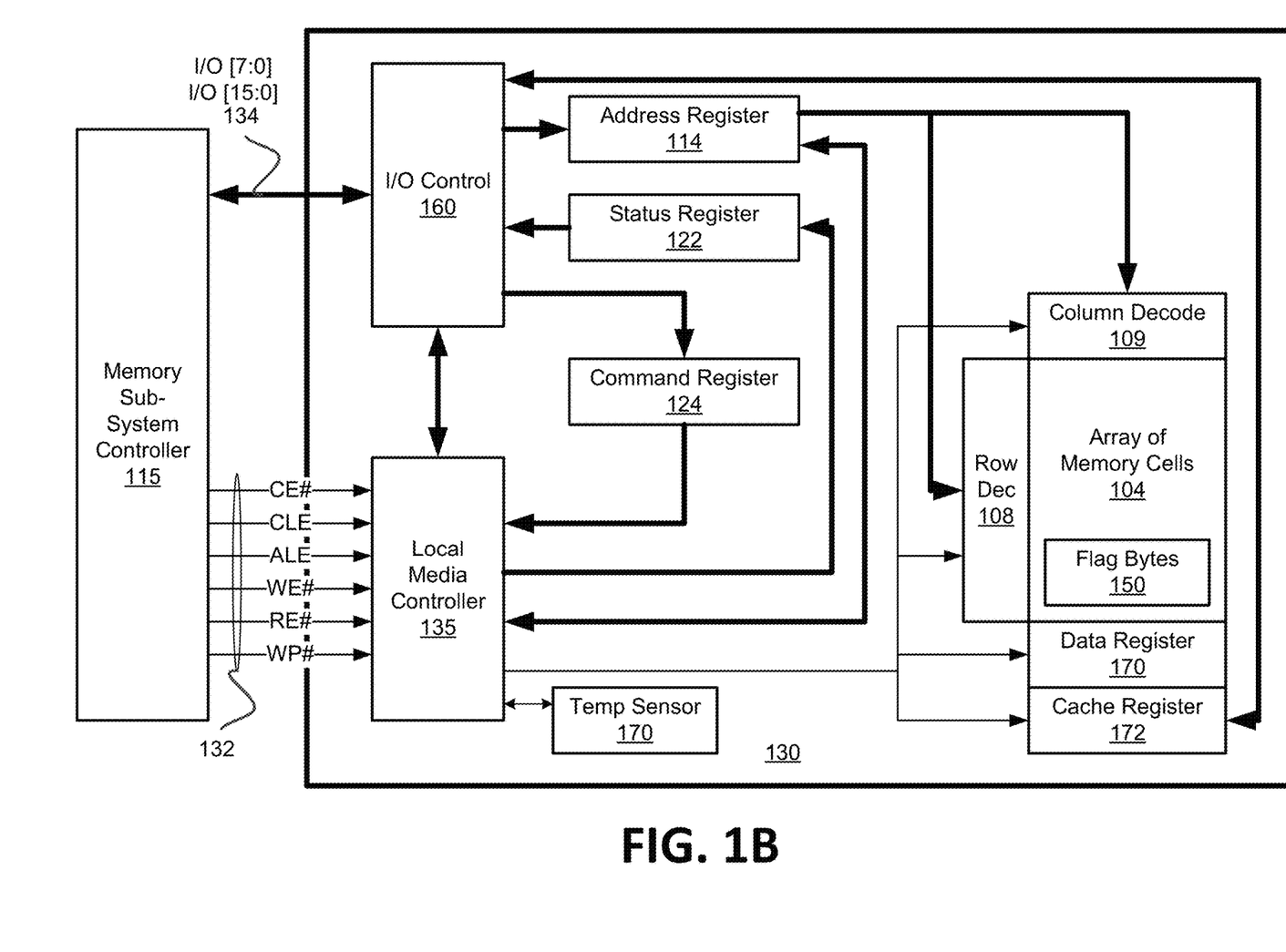
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. As described herein, local media controller 135 can utilize information stored in flag bytes 150 of memory array 104 to perform on-die cross-temperature management for memory device 130. In one embodiment, local media controller 135 is in communication with a temperature sensor 170 disposed within or adjacent to memory device 130. Temperature sensor 170 can be used to measure an ambient temperature at certain points in time, which can represent, for example, a write temperature or a read temperature.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
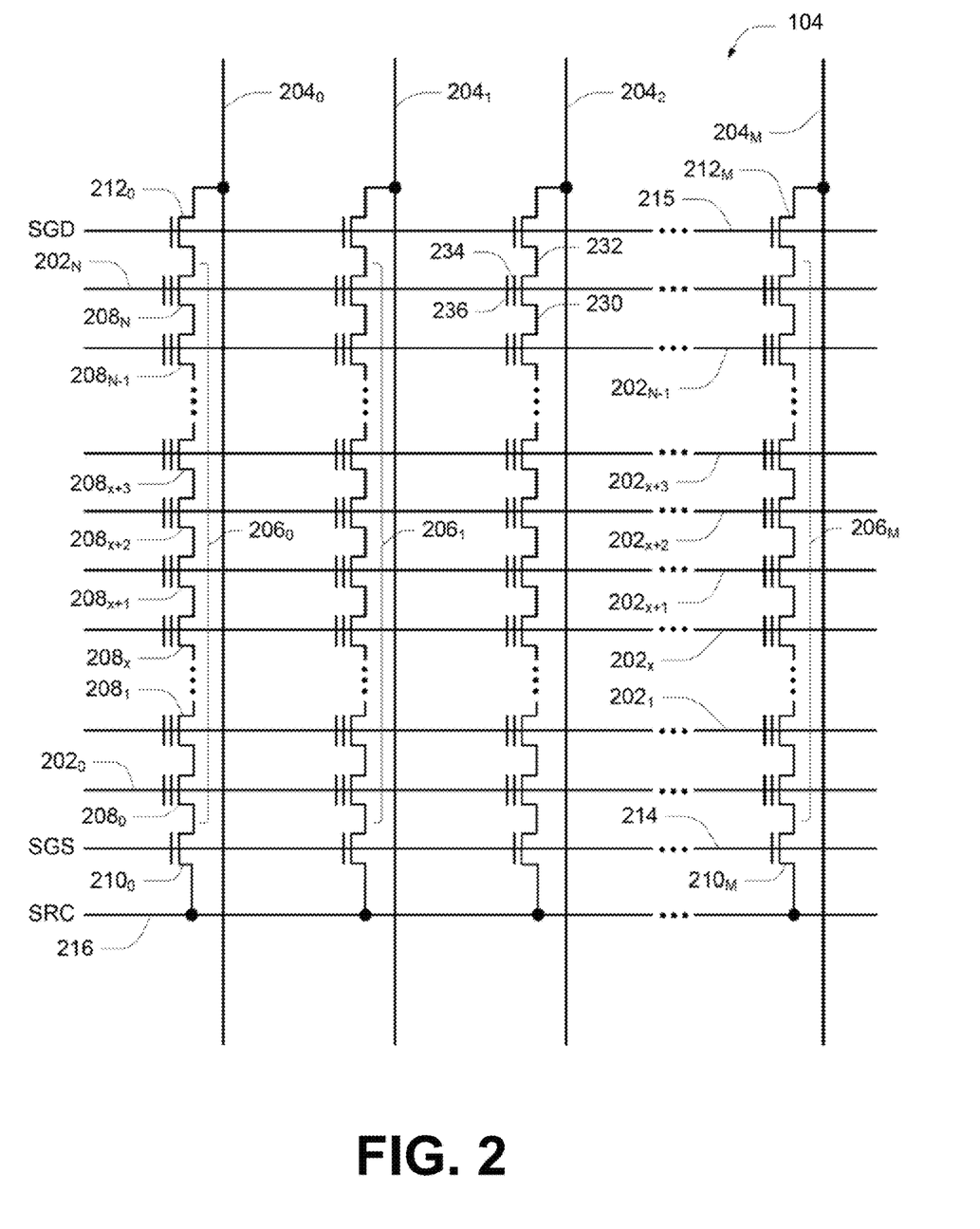
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string 206o. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string 206o. The source of each select gate 212 can be connected to a memory cell $208_N$ of the corresponding NAND string 206. For example, the source of select gate $212_0$ can be connected to memory cell $208_N$ of the corresponding NAND string 206o. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines 204o, 2042, 2044, etc.) can be one physical page of the memory cells 208 (e.g., even memory cells) while memory cells 208 commonly connected to wordline $202_N$ and selectively connected to odd bit lines 204 (e.g., bit lines 2041, 2043, 2045, etc.) can be another physical page of the memory cells 208 (e.g., odd memory cells).

Although bit lines 2043-2045 are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

Figure 3:
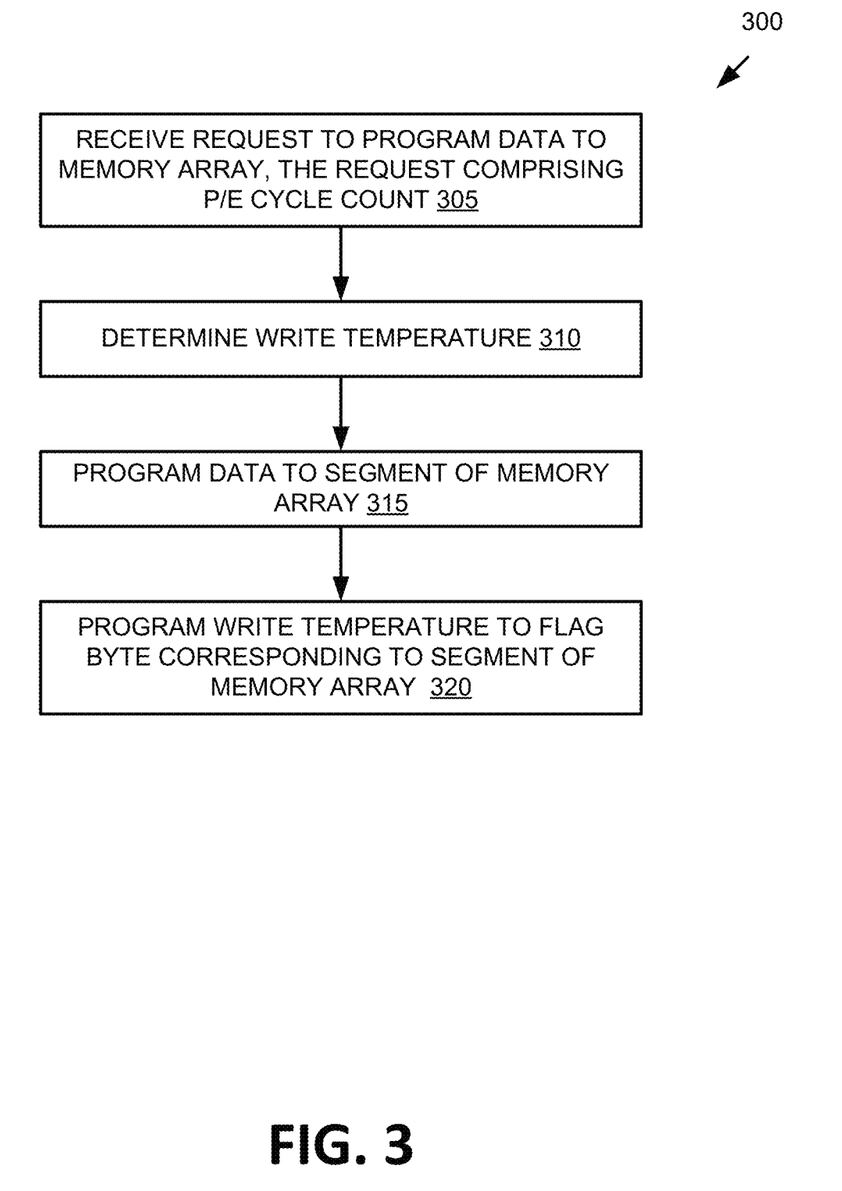
FIG. 3 is a flow diagram of an example method of storing cross-temperature data on a memory device during a program operation in accordance with some embodiments of the present disclosure.

FIG. 3 is a flow diagram of an example method of storing cross-temperature data on a memory device during a program operation in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, a request is received. For example, control logic (e.g., local media controller 135) can receive a request to program data to a memory array, such as memory array 104, of a memory device, such as memory device 130. In one embodiment, the request is received from a requestor, such as memory interface 113 of memory sub-system controller 115, or host system 120. In one embodiment, the request includes data, such as host data or user data, to be programmed to a segment (e.g., a page, block, etc.) of memory device 130, as well as an indication of a program/erase (P/E) cycle count associated with the segment where the data is to be stored. In one embodiment, memory sub-system controller 115 tracks a number of program/erase cycles (e.g., my incrementing a corresponding counter) that have been performed on the segment over the lifetime of the memory device 130. Depending on the embodiment, the program/erase cycle count included with the request indicates a number of previously performed program/erase cycles or an updated number of program/erase cycles (e.g., including the program operation to be performed in response to the current request).

At operation 310, a write temperature is determined. For example, the control logic can determine the write temperature at a time when the request to program the data is received. In one embodiment, the request received at operation 305 includes an indication of the write temperature provided by memory sub-system controller 115 and so the control logic can read the indication of the write temperature from the request. In another embodiment, the control logic can receive a value from a temperature sensor on the memory device 130, such as temperature sensor 170. Depending on the embodiment, the control logic can either query temperature sensor 170 for a new write temperature measurement in response to receiving the write request at operation 305, or can use a most recently measured temperature value as the write temperature (e.g., when temperature measurements are routinely taken at periodic intervals on memory device 130).

At operation 315, data is programmed. For example, the control logic can program the host data received with the request at operation 305 to the identified segment of memory array 104. In one embodiment, the control logic can cause one or more programming voltage signals to be applied to the wordlines 202 of the memory array 104 corresponding to the identified segment.

At operation 320, temperature data is programmed. For example, the control logic can program the write temperature determined at operation 310 received with the request at operation 305, or otherwise determined at operation 310, to a designated area, such as one of flag bytes 150, corresponding to the segment of the memory array 104. In one embodiment, each segment (e.g., page) of memory array 104 as one or more corresponding flag bytes 150 used to store metadata associated with the programmed host data. The flag bytes 150 can be restricted areas of the memory array 104 that store system data or other metadata, and are typically not accessible or usable by the host system 120. In other embodiments, the control logic can store the write temperature and the program/erase cycle count in some other designated area on memory device 130. In one embodiment, the write temperature and the program/erase cycle count remain in the flag byte 150 until the host data is read from the segment of memory array 104. At that time, the control logic can determine whether to perform a corrective action to calibrate a read voltage level to be applied to memory array 104 to read the host data from the segment based on the cross-temperature, as described in more detail below with respect to FIG. 4 and FIG. 5.

Figure 4:
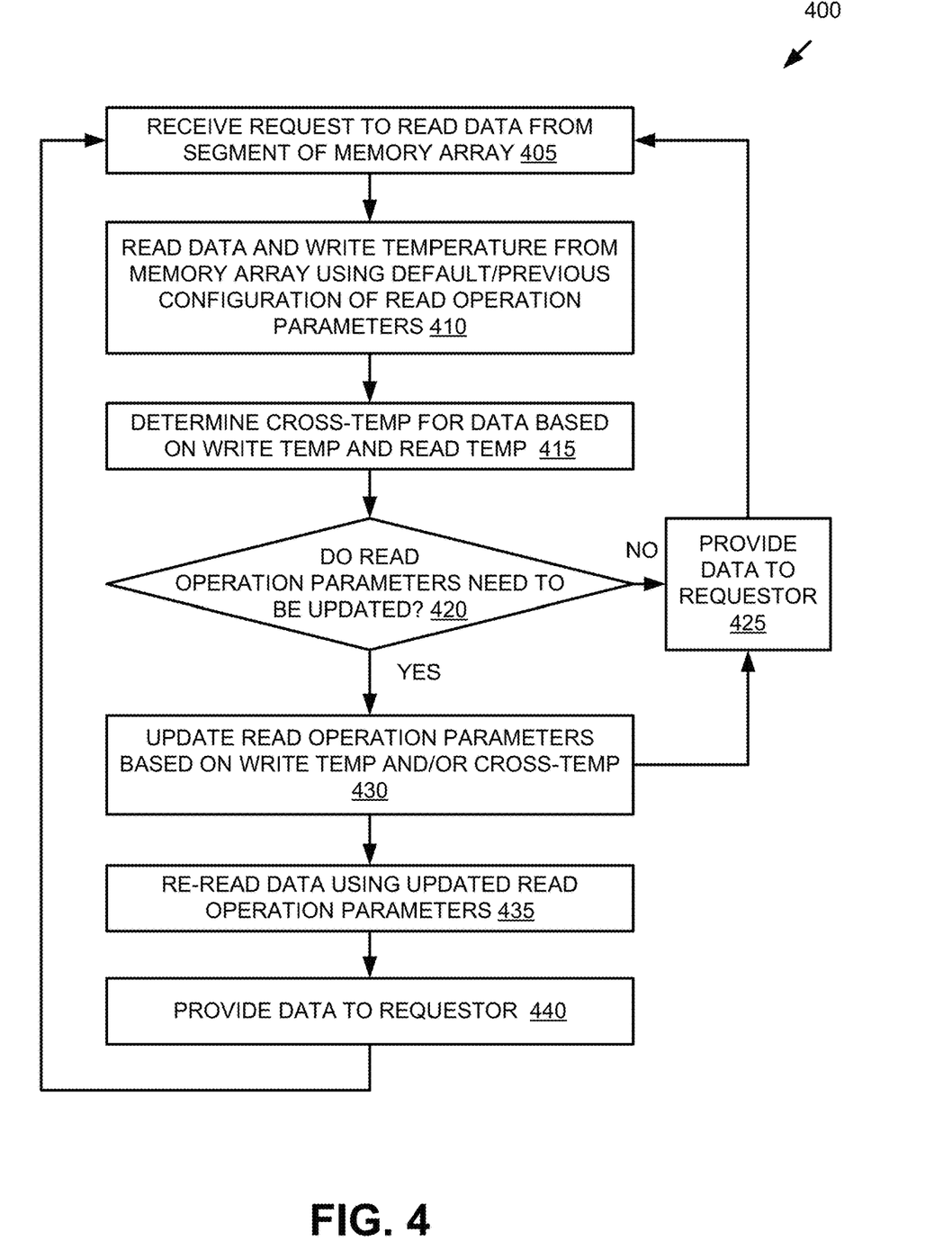
FIG. 4 is a flow diagram of an example method of on-die cross-temperature compensation in a memory sub-system in accordance with some embodiments of the present disclosure.

FIG. 4 is a flow diagram of an example method of on-die cross-temperature compensation in a memory sub-system in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a request is received. For example, control logic (e.g., local media controller 135) can receive a request to read data from a memory array, such as memory array 104, of a memory device, such as memory device 130. In one embodiment, the request is received from a requestor, such as memory interface 113 of memory sub-system controller 115, or host system 120. In one embodiment, the request includes an indication of a segment (e.g., a page) of the memory array 104 where the data is stored.

At operation 410, a read operation is performed. For example, the control logic can perform, using previously configured read operation parameters, a first read operation to read the data and a write temperature associated with the data from the memory array 104. As described above with respect to FIG. 3, in some embodiments, the control logic can program the write temperature data to the flag byte 150 at the time the host data is programmed to the segment of the memory array 104. In one embodiment, when the read request is received at operation 405, the control logic can identify the flag byte 150 corresponding to the segment indicated in the read request and read the write temperature (i.e., an indication of the ambient temperature at the time the data was programmed to memory array 104) stored in the flag byte 150. The write temperature can be identified in the flag byte 150 by a unique identifier or there can be a designated field in the flag byte 150 where the write temperature is stored. In one embodiment, the data and write temperature are read when the control logic causes a read voltage to be applied to corresponding wordlines of the memory array 104. The previously configured read operation parameters can include a specific read voltage level (or read voltage offset). The read voltage level used in the first read operation can include a default read voltage level or a read voltage level determined based on one or more temperature values associated with a previous read operation performed on the segment of the memory device 130.

At operation 415, a cross-temperature is determined. For example, the control logic can determine a cross-temperature for the data based on the write temperature and a read temperature at a time when the request to read the data is received at operation 405. In one embodiment, to determine the cross-temperature, the control logic can determine a difference between the write temperature and the read temperature. In one embodiment, the request received at operation 405 includes an indication of the read temperature provided by memory sub-system controller 115 and so the control logic can read the indication of the read temperature from the request. In another embodiment, the control logic can receive a value from a temperature sensor on the memory device 130, such as temperature sensor 170. Depending on the embodiment, the control logic can either query temperature sensor 170 for a new read temperature measurement in response to receiving the read request at operation 405, or can use a most recently measured temperature value as the read temperature (e.g., when temperature measurements are routinely taken at periodic intervals on memory device 130).

At operation 420, a determination is made. For example the control logic can determine whether the read operation parameters need to be updated based on whether the previously configured read operation parameters satisfy a temperature criterion. In one embodiment, the control logic determines the updated read operation parameters (e.g., based on at least one of the write temperature or the cross-temperature) and determines whether the previously configured read operation parameters correspond to the updated read operation parameters. In one embodiment, using either or both of the write temperature determined at operation 410 and the cross-temperature determined at operation 415 as inputs, the control logic can identify a corresponding entry in a data structure, such as a look-up table, stored on memory device 130, where the entry includes an indication of corresponding parameters (e.g., read voltage offset). In one embodiment, different combinations of cross-temperatures and write temperatures (and/or read temperatures) can have different read voltage offsets (i.e., an amount by which the default read voltage can be increased or decreased when performing a read operation). If the previously configured read operation parameters match or are at least within a threshold deviation of the updated read operation parameters, the control logic can determine a correspondence (i.e., that the temperature criterion is satisfied). If the correspondence exists, the control logic determines that the read operation parameters do not need to be updated and, at operation 425, provides the data read during the first read operation to the requestor.

Responsive to determining that the previously configured read operation parameters do not correspond to the updated read operation parameters (i.e., that the temperature criterion is not satisfied), the control logic determines that the read operation parameters do need to be updated and, at operation 430, an update is performed. For example, the control logic can configure the memory device 130 with the updated read operation parameters based on the write temperature and/or the cross-temperature. In one embodiment, the control logic loads values representing the updated read operation parameters into corresponding registers to control the read voltage level during subsequent read operations performed on memory array 104.

At operation 435, another read operation is performed. For example, the control logic can perform, using the updated read operation parameters, a second read operation to read the data from the memory array 104. The control logic can apply a modified read voltage level to the wordlines of the memory array 104 associated with the segment being read. Similarly, local media controller 135 can modify other parameters, such as the precharge time or sensing time for the read operation. Depending on the embodiment, one or more parameters of the read operation can be adjusted at the same time. At operation 440, the control logic can provide the data read during the second read operation to the requestor.

Figure 5:
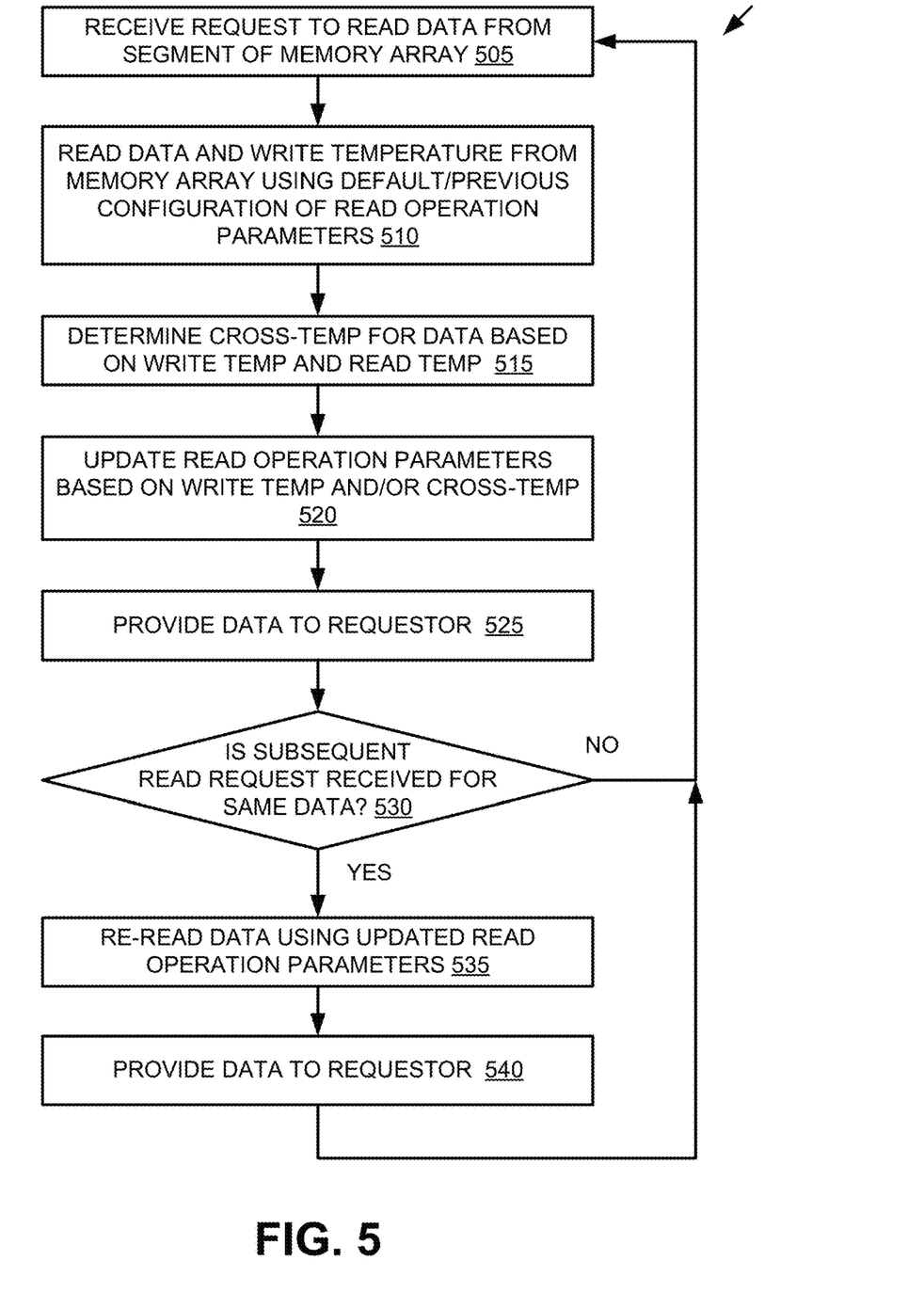
FIG. 5 is a flow diagram of an example method of true cross-temperature compensation in a memory sub-system in accordance with some embodiments of the present disclosure.

FIG. 5 is a flow diagram of an example method of true cross-temperature compensation in a memory sub-system in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by local media controller 135 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a request is received. For example, control logic (e.g., local media controller 135) can receive a request to read data from a memory array, such as memory array 104, of a memory device, such as memory device 130. In one embodiment, the request is received from a requestor, such as memory interface 113 of memory sub-system controller 115, or host system 120. In one embodiment, the request includes an indication of a segment (e.g., a page) of the memory array 104 where the data is stored.

At operation 510, a read operation is performed. For example, the control logic can perform, using previously configured read operation parameters, a first read operation to read the data and a write temperature associated with the data from the memory array 104. As described above with respect to FIG. 3, in some embodiments, the control logic can program the write temperature data to the flag byte 150 at the time the host data is programmed to the segment of the memory array 104. In one embodiment, when the read request is received at operation 505, the control logic can identify the flag byte 150 corresponding to the segment indicated in the read request and read the write temperature (i.e., an indication of the ambient temperature at the time the data was programmed to memory array 104) stored in the flag byte 150. The write temperature can be identified in the flag byte 150 by a unique identifier or there can be a designated field in the flag byte 150 where the write temperature is stored. In one embodiment, the data and write temperature are read when the control logic causes a read voltage to be applied to corresponding wordlines of the memory array 104. The previously configured read operation parameters can include a specific read voltage level (or read voltage offset). The read voltage level used in the first read operation can include a default read voltage level or a read voltage level determined based on one or more temperature values associated with a previous read operation performed on the segment of the memory device 130.

At operation 515, a cross-temperature is determined. For example, the control logic can determine a cross-temperature for the data based on the write temperature and a read temperature at a time when the request to read the data is received at operation 505. In one embodiment, to determine the cross-temperature, the control logic can determine a difference between the write temperature and the read temperature. In one embodiment, the request received at operation 505 includes an indication of the read temperature provided by memory sub-system controller 115 and so the control logic can read the indication of the read temperature from the request. In another embodiment, the control logic can receive a value from a temperature sensor on the memory device 130, such as temperature sensor 170. Depending on the embodiment, the control logic can either query temperature sensor 170 for a new read temperature measurement in response to receiving the read request at operation 505, or can use a most recently measured temperature value as the read temperature (e.g., when temperature measurements are routinely taken at periodic intervals on memory device 130).

At operation 520, an update is performed. For example, the control logic can configure the memory device 130 with the updated read operation parameters based on the write temperature and/or the cross-temperature. In one embodiment, the control logic loads values representing updated read operation parameters into corresponding registers to control the read voltage level during subsequent read operations performed on memory array 104. In one embodiment, the control logic determines the updated read operation parameters (e.g., based on at least one of the write temperature or the cross-temperature). In one embodiment, using either or both of the write temperature determined at operation 510 and the cross-temperature determined at operation 515 as inputs, the control logic can identify a corresponding entry in a data structure, such as a look-up table, stored on memory device 130, where the entry includes an indication of corresponding parameters (e.g., read voltage offset). In one embodiment, different combinations of cross-temperatures and write temperatures (and/or read temperatures) can have different read voltage offsets (i.e., an amount by which the default read voltage can be increased or decreased when performing a read operation). At operation 525, the control logic provides the data read during the first read operation to the requestor.

At operation 530, a determination is made. For example, the control logic can determine whether a request to re-read the data in the memory array 104 is received from the requestor. In one embodiment, the request to re-read the data from the memory array 104 is received responsive to the requestor (e.g., memory sub-system controller 115) determining that an error rate in the data read during the first read operation exceeds an error correction capability of the requestor.

If a request to re-read the data is received, at operation 535, another read operation is performed. For example, the control logic can perform, using the updated read operation parameters, a second read operation to read the data from the memory array 104. The control logic can apply a modified read voltage level to the wordlines of the memory array 104 associated with the segment being read. Similarly, local media controller 135 can modify other parameters, such as the precharge time or sensing time for the read operation. Depending on the embodiment, one or more parameters of the read operation can be adjusted at the same time. At operation 540, the control logic can provide the data read during the second read operation to the requestor.

Figure 6:
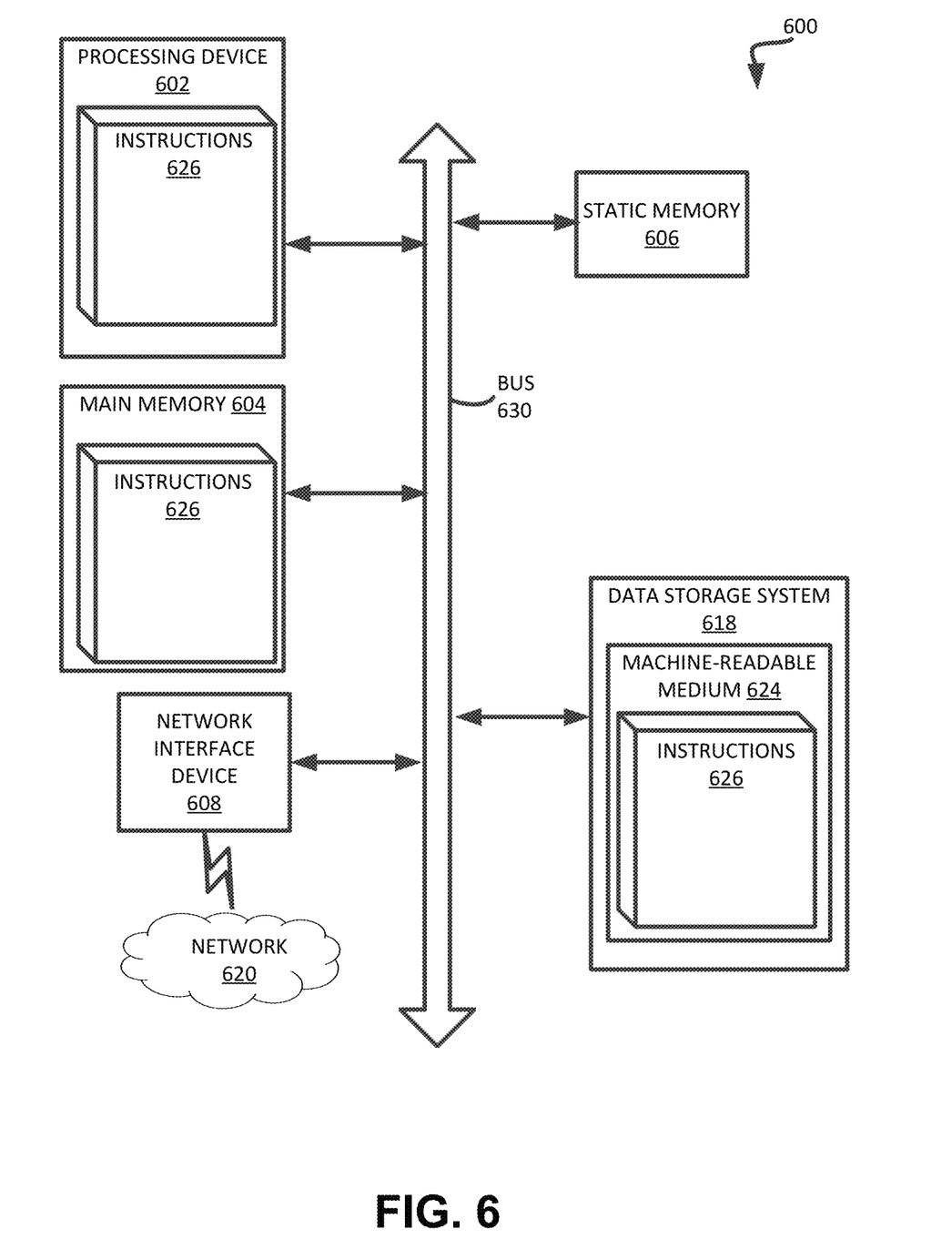
FIG. 6 is a block diagram of an example computer system in which embodiments of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to the memory sub-system 110 of FIG. 1.

In one embodiment, the instructions 626 include instructions to implement functionality corresponding to the local media controller 135 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
    a memory array; and
    control logic, operatively coupled with the memory array, to perform operations comprising:
        receiving, from a requestor, a request to read data from the memory array, the request comprising an indication of a segment of the memory array where the data is stored;
        performing, using previously configured read operation parameters, a first read operation to read the data and a write temperature associated with the data from the memory array;
        determining whether the previously configured read operation parameters satisfy a temperature criterion;
        responsive to determining that the previously configured read operation parameters do not satisfy the temperature criterion, configuring the memory device with updated read operation parameters; and
        performing, using the updated read operation parameters, a second read operation to read the data from the memory array.

2. The memory device of claim 1, wherein the control logic is to perform operations further comprising:
    providing the data read during the second read operation to the requestor.

3. The memory device of claim 1, wherein determining whether the previously configured read operation parameters satisfy a temperature criterion comprises:
    determining the updated read operation parameters;
    determining whether the previously configured read operation parameters correspond to the updated read operation parameters; and
    responsive to determining that the previously configured read operation parameters do not correspond to the updated read operation parameters, determining that the previously configured read operation parameters do not satisfy the temperature criterion.

4. The memory device of claim 3, wherein the control logic is to perform operations further comprising:
    determining a cross-temperature for the data based on the write temperature and a read temperature at a time when the request to read the data is received.

5. The memory device of claim 4, wherein the updated read operation parameters are determined based on at least one of the write temperature or the cross-temperature.

6. The memory device of claim 5, wherein configuring the memory device with the updated read operation parameters comprises:
    adjusting a read voltage level to be applied to the memory array to read the data from the segment by a corresponding offset amount.

7. The memory device of claim 1, wherein the control logic is to perform operations further comprising:

responsive to determining that the previously configured read operation parameters do satisfy the temperature criterion, providing the data read during the first read operation to the requestor.

8. The memory device of claim 1, wherein the requestor comprises a memory sub-system controller coupled to the memory device.

9. A memory device comprising:
a memory array; and
control logic, operatively coupled with the memory array, to perform operations comprising:
receiving, from a requestor, a request to read data from the memory array, the request comprising an indication of a segment of the memory array where the data is stored;
performing, using previously configured read operation parameters, a first read operation to read the data and a write temperature associated with the data from the memory array;
providing the data read during the first read operation to the requestor;
configuring the memory device with updated read operation parameters based at least in part on the write temperature;
receiving, from the requestor, a request to re-read the data from the memory array; and
performing, using the updated read operation parameters, a second read operation to read the data from the memory array.

10. The memory device of claim 9, wherein the control logic is to perform operations further comprising:
providing the data read during the second read operation to the requestor.

11. The memory device of claim 9, wherein the control logic is to perform operations further comprising:
determining a cross-temperature for the data based on the write temperature and a read temperature at a time when the request to read the data is received.

12. The memory device of claim 11, wherein the updated read operation parameters are determined based on at least one of the write temperature or the cross-temperature.

13. The memory device of claim 12, wherein configuring the memory device with the updated read operation parameters comprises:
adjusting a read voltage level to be applied to the memory array to read the data from the segment by a corresponding offset amount.

14. The memory device of claim 9, wherein the request to re-read the data from the memory array is received responsive to the requestor determining that an error rate in the data read during the first read operation exceeds an error correction capability of the requestor.

15. A method comprising:
receiving, from a requestor, a request to read data from a memory array of a memory device, the request comprising an indication of a segment of the memory array where the data is stored;
performing, using previously configured read operation parameters, a first read operation to read the data and a write temperature associated with the data from the memory array;
providing the data read during the first read operation to the requestor;
configuring the memory device with updated read operation parameters based at least in part on the write temperature;
receiving, from the requestor, a request to re-read the data from the memory array; and
performing, using the updated read operation parameters, a second read operation to read the data from the memory array.

16. The method of claim 15, further comprising:
providing the data read during the second read operation to the requestor.

17. The method of claim 15, further comprising:
determining a cross-temperature for the data based on the write temperature and a read temperature at a time when the request to read the data is received.

18. The method of claim 17, wherein the updated read operation parameters are determined based on at least one of the write temperature or the cross-temperature.

19. The method of claim 18, wherein configuring the memory device with the updated read operation parameters comprises:
adjusting a read voltage level to be applied to the memory array to read the data from the segment by a corresponding offset amount.

20. The method of claim 15, wherein the request to re-read the data from the memory array is received responsive to the requestor determining that an error rate in the data read during the first read operation exceeds an error correction capability of the requestor.

* * * * *